(12) United States Patent
Yoshikawa et al.

(10) Patent No.: US 11,240,908 B2
(45) Date of Patent: Feb. 1, 2022

(54) THIN FILM CAPACITOR AND CIRCUIT BOARD INCORPORATING THE SAME

(71) Applicant: TDK Corporation, Tokyo (JP)

(72) Inventors: Kazuhiro Yoshikawa, Tokyo (JP); Yuuki Aburakawa, Tokyo (JP); Tatsuo Namikawa, Tokyo (JP); Kenichi Yoshida, Tokyo (JP); Hitoshi Saita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 65 days.

(21) Appl. No.: 16/665,503

(22) Filed: Oct. 28, 2019

(65) Prior Publication Data

US 2020/0137883 A1    Apr. 30, 2020

(30) Foreign Application Priority Data

Oct. 29, 2018 (JP) ............................. JP2018-202468
Oct. 11, 2019 (JP) ............................. JP2019-187615

(51) Int. Cl.
*H05K 1/00* (2006.01)
*H05K 1/02* (2006.01)
*H05K 1/11* (2006.01)
*H05K 1/16* (2006.01)

(52) U.S. Cl.
CPC ........... *H05K 1/0231* (2013.01); *H05K 1/113* (2013.01); *H05K 1/162* (2013.01); *H05K 2201/0179* (2013.01)

(58) Field of Classification Search
CPC ...... H05K 1/0231; H05K 1/113; H05K 1/162; H05K 2201/0179
See application file for complete search history.

(56) References Cited

U.S. PATENT DOCUMENTS

| 6,218,729 | B1 * | 4/2001 | Zavrel, Jr. | ........... H01L 23/5383 257/698 |
| 2003/0136997 | A1 * | 7/2003 | Shioga | ........... H01L 21/76804 257/306 |
| 2006/0137905 | A1 | 6/2006 | Kariya et al. | |
| 2007/0132063 | A1 * | 6/2007 | Min | ........... H05K 1/162 257/532 |
| 2008/0003765 | A1 * | 1/2008 | Seh | ........... H05K 1/162 438/396 |
| 2008/0142253 | A1 * | 6/2008 | Salama | ........... H05K 1/162 174/258 |
| 2016/0027579 | A1 * | 1/2016 | Kurachi | ........... H01G 4/12 361/321.1 |
| 2016/0262260 | A1 * | 9/2016 | Oyamada | ........... H01L 24/17 |

FOREIGN PATENT DOCUMENTS

JP    2005-191559 A    7/2005

* cited by examiner

*Primary Examiner* — Pete T Lee
(74) *Attorney, Agent, or Firm* — McDermott Will & Emery LLP

(57) ABSTRACT

Disclosed herein is a thin film capacitor that includes a capacitive insulating film, a first metal film formed on one surface of the capacitive insulating film, and a second metal film formed on other surface of the capacitive insulating film and made of a metal material different from that of the first metal film. The thin film capacitor has an opening penetrating the capacitive insulating film, first metal film, and second metal film. The second metal film is thicker than the first metal film. A first size of a part of the opening that penetrates the first metal film is larger than a second size of a part of the opening that penetrates the second metal film.

14 Claims, 19 Drawing Sheets

THIN FILM CAPACITOR AND CIRCUIT BOARD INCORPORATING THE SAME

BACKGROUND OF THE INVENTION

Field of the Invention

The present invention relates to a thin film capacitor and a circuit board incorporating the thin film capacitor and, more particularly, to a thin film capacitor capable of being embedded in a circuit board and used and a circuit board incorporating the thin film capacitor.

Description of Related Art

In general, a decoupling capacitor is mounted on a circuit board on which an IC is mounted for stabilizing the potential of a power supply to be fed to the IC. A laminated ceramic chip capacitor is generally used as the decoupling capacitor, and a required decoupling capacitance is ensured by mounting many laminated ceramic chip capacitors on the surface of a circuit board.

However, in recent years, it is often the case that a space on a circuit board for mounting many laminated ceramic chip capacitors is insufficient. Thus, there has been proposed a method of using a thin film capacitor in place of the laminated ceramic chip capacitor and embedding the thin film capacitor in the circuit board (see JP 2005-191559 A).

In order to enable the thin film capacitor to be embedded in the circuit board, it is necessary to reduce the overall thickness of the thin film capacitor as much as possible. However, when the thin film capacitor is reduced in thickness, it may be easily warped. To prevent the warpage of the thin film capacitor, the thicknesses and materials of metal films formed on the front and back sides of a capacitive insulating film are made the same as each other; however, it is not realistic to make the thicknesses and materials thereof the same as each other.

SUMMARY

It is therefore an object of the present invention to provide a thin film capacitor whose warpage can be suppressed without making the thicknesses or materials of metal films formed on the front and back sides of a capacitive insulating film the same as each other and a circuit board incorporating the thin film capacitor.

A thin film capacitor according to the present invention includes a capacitive insulating film, a first metal film formed on one surface of the capacitive insulating film, and a second metal film formed on the other surface of the capacitive insulating film and made of a metal material different from that of the first metal film and has an opening penetrating the capacitive insulating film, first metal film, and second metal film. The second metal film is thicker than the first metal film. Assuming that the size of a part of the opening that penetrates the first metal film is a first size and that the size of a part of the opening that penetrates the second metal film is a second size, the first size is larger than the second size.

Further, a circuit board according to the present invention is a circuit board in which the above thin film capacitor is embedded and includes a via conductor that passes through the opening without contacting the first and second metal films.

According to the present invention, since the opening that penetrates the capacitive insulating film, first metal film and second metal film is formed, stress due to a difference in thickness or metal material between the first and second metal films is released through the opening. In addition, the second metal film is made thicker than the first metal film, and the first size is made larger than the second size, so that rigidity is ensured by the thicker second metal film, thereby significantly suppressing warpage. Thus, warpage of the thin film capacitor that may occur when it is embedded in the circuit board can be minimized.

In the thin film capacitor according to the present invention, the opening may comprise a plurality of openings, and assuming that an area where the capacitive insulating film is sandwiched between the first and second metal films in a plan view is a capacitive area and that an area where the capacitive insulating film is not present and an area where the capacitive insulating film is not sandwiched between the first and second metal films in a plan view is a non-capacitive area, the ratio of the capacitive area to the sum of the capacitive area and non-capacitive area may be set to 80% or less. This allows further suppression of warpage that may occur in the thin film capacitor.

In the present invention, assuming that the size of a part of the opening that penetrates the capacitive insulating film is a third size, the third size may be smaller than the first size. In addition, assuming that the size of a part of the opening that penetrates the second metal film at the boundary of the capacitive insulating film is a fourth size, the third size may be smaller than the fourth size. This increases the creepage distance between the first and second metal films inside the opening, thereby making it possible to improve withstand voltage.

In the present invention, the opening may be filled with an insulating material. This can improve product reliability.

As described above, according to the present invention, there can be provided a thin film capacitor whose warpage can be suppressed without making the thicknesses or materials of metal films formed on the front and back sides of a capacitive insulating film the same as each other and a circuit board incorporating the thin film capacitor.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 2A illustrates a first example and FIG. 2B illustrates a second example;

DETAILED DESCRIPTION OF THE EMBODIMENTS

Preferred embodiments of the present invention will now be explained in detail with reference to the drawings.

First Embodiment

Figure 1:
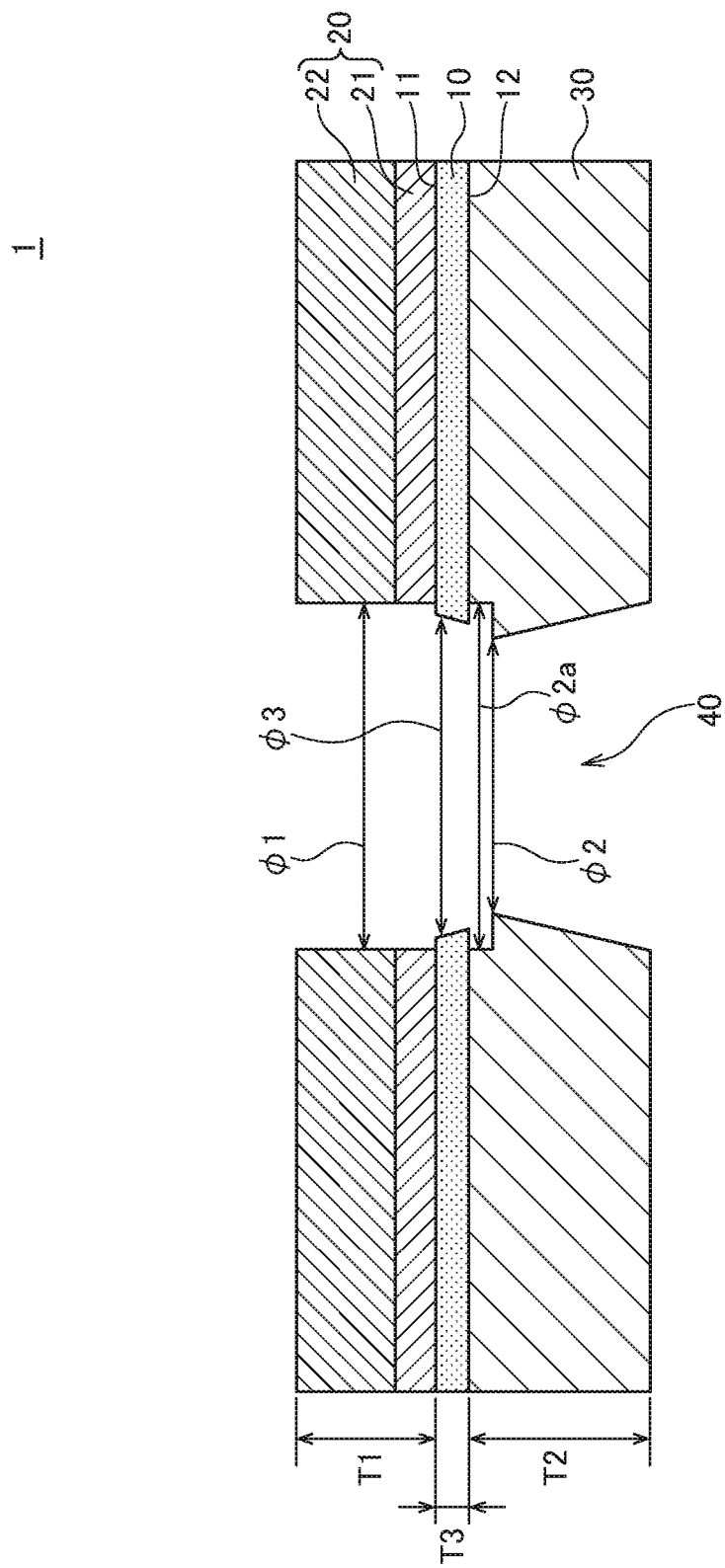
FIG. 1 is a schematic cross-sectional view for explaining the configuration of a thin film capacitor according to a first embodiment of the present invention.
Figure 2B:
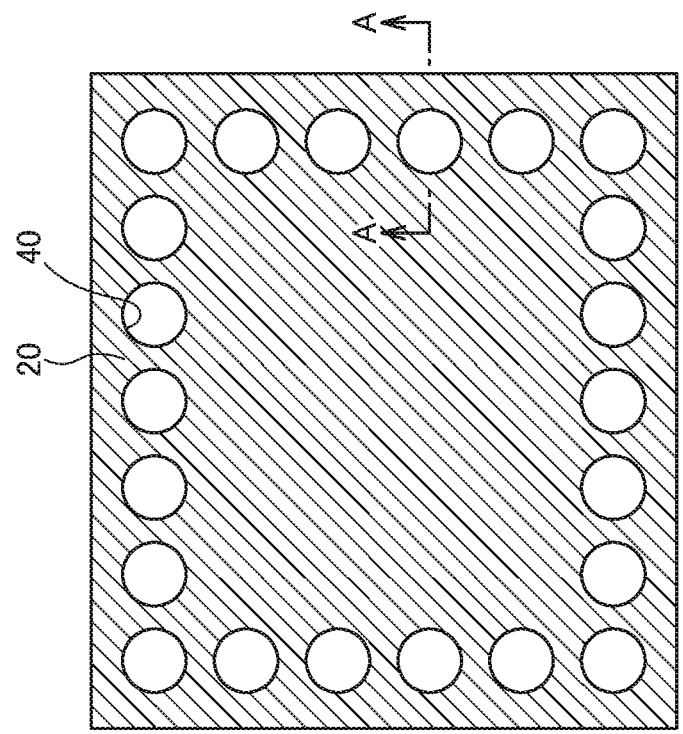
FIGS. 2A and 2B are partial plan views of the thin film capacitor shown in FIG. 1, where
Figure 2A:
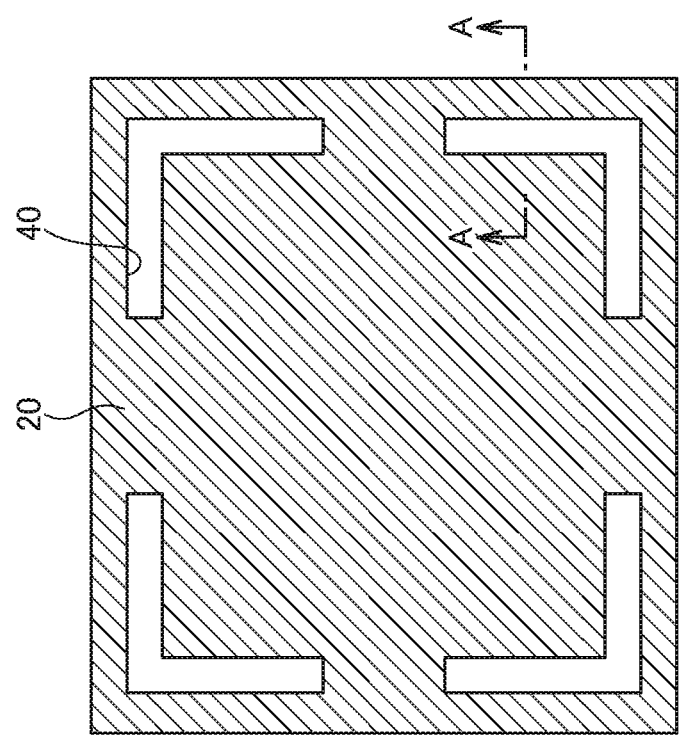

FIG. 1 is a schematic cross-sectional view for explaining the configuration of a thin film capacitor 1 according to the first embodiment of the present invention. FIGS. 2A and 2B are partial plan views of the thin film capacitor 1 and illustrate a first example and a second example, respectively. The cross section illustrated in FIG. 1 corresponds to that taken along line A-A in FIG. 2.

As illustrated in FIGS. 1 and 2A and 2B, the thin film capacitor 1 according to the present embodiment includes a capacitive insulating film 10, a first metal film 20 formed on one surface 11 of the capacitive insulating film 10, and a second metal film 30 formed on the other surface 12 of the capacitive insulating film 10. The capacitive insulating film 10 is made of a ceramic material having a perovskite structure, such as barium titanate. The metal film 20 has a structure in which a seed layer 21 and a plated film 22 are laminated. The seed layer 21 is made of, e.g., a laminated film of nickel (Ni) and copper (Cu), and the plated film 22 is made of copper (Cu). The metal film 30 serves as a base material of the thin film capacitor 1 according to the present embodiment and is made of, e.g., nickel (Ni).

In the present embodiment, assuming that the thicknesses of the metal film 20, metal film 30 and capacitive insulating film 10 are set to T1, T2 and T3, respectively, the following relationship is satisfied:

$$T2 > T1 > T3.$$

T1 is in the range of 5 μm to 20 μm and set to, e.g., about 10 μm, and T2 is in the range of 8 μm to 50 μm and set to, e.g., about 15 μm. T3 is set to about 3 μm.

As described above, the overall thickness of the thin film capacitor 1 according to the present embodiment is very small. In addition, the metal films 20 and 30 formed on the front and back sides of the capacitive insulating film 10 differ from each other in terms of thickness and material. Thus, the capacitive insulating film 10 is very easily warped if no measure is taken. However, in the present embodiment, such warpage stress is partially released through an opening 40 formed so as to penetrate the capacitive insulating film 10 and the metal films 20 and 30. As illustrated in FIGS. 2A and 2B, a plurality of openings 40 are formed. The planar shape of the opening 40 is an L-shape in the example of FIG. 2A, and is a circular shape in the example of FIG. 2B. Thus, the planar shape of the opening 40 is not particularly limited.

The higher the formation density of the openings 40 is, the more stress is released to reduce warpage, but a capacitance value to be obtained is reduced. The following configuration is preferable in order to sufficiently reduce the warpage of the thin film capacitor 1. That is, assuming that an area that functions as a capacitor, i.e., an area where the capacitive insulating film 10 is sandwiched between the metal films 20 and 30 in a plan view is a capacitive area C1 and that an area that does not function as a capacitor, i.e., an area where the capacitive insulating film 10 is not present and an area where the capacitive insulating film 10 is not sandwiched between the metal films 20 and 30 in a plan view is a non-capacitive area C2, the ratio (C1/(C1+C2)) of the capacitive area C1 to the sum of the capacitive area C1 and non-capacitive area C2 is preferably set to 80% or less. However, in this case, a capacitance value is reduced by 20% or more as compared to the instance where the openings 40 are not formed.

Further, in the present embodiment, assuming that the sizes of a part of each opening 40 that penetrates the metal film 20, a part of each opening 40 that penetrates the metal film 30 and a part of each opening 40 that penetrates the capacitive insulating film 10 are φ1, φ2 and φ3, respectively, the following relationship is satisfied:

$$\varphi1 > \varphi3 > \varphi2.$$

In addition, assuming that the size of a part of each opening 40 that penetrates the metal film 30 at the boundary of the capacitive insulating film 10 is φ2a, the following relationship is satisfied:

$$\varphi1 > \varphi2a > \varphi3.$$

When the opening 40 has an elongated shape in a plan view as illustrated in FIG. 2A, the sizes φ1 to φ3 are defined by the width thereof in the short-side direction, and when the opening 40 has a circular shape in a plan view as illustrated in FIG. 2B, the sizes φ1 to φ3 are defined by the diameter thereof. Further, when the size of the capacitive insulating film 10, metal film 20, or metal film 30 is not constant in the depth direction, each of the sizes φ1, φ2 and φ3 is defined by the narrowest part thereof. The size φ1 is about 150 μm to about 250 μm, and the sizes φ2 and φ3 are each about 100 μm to about 200 μm.

As described above, in the thin film capacitor 1 according to the present embodiment, the size φ2 of the opening 40 in the metal film 30 having a larger thickness is smaller than the size φ1 of the opening 40 in the metal film 20 having a smaller thickness, so that rigidity is ensured by the thicker metal film 30 to thereby suppress the warpage of the thin film capacitor 1. In addition, in the present embodiment, the size φ3 of the opening 40 in the capacitive insulating film 10 is smaller than the sizes φ1 and φ2, causing the capacitive insulating film 10 to protrude to the inside of the opening 40 as illustrated in FIG. 1. As a result, the creepage distance between the metal films 20 and 30 inside the opening 40 is increased, thereby preventing deterioration in withstand voltage due to the presence of the opening 40.

Figure 3:
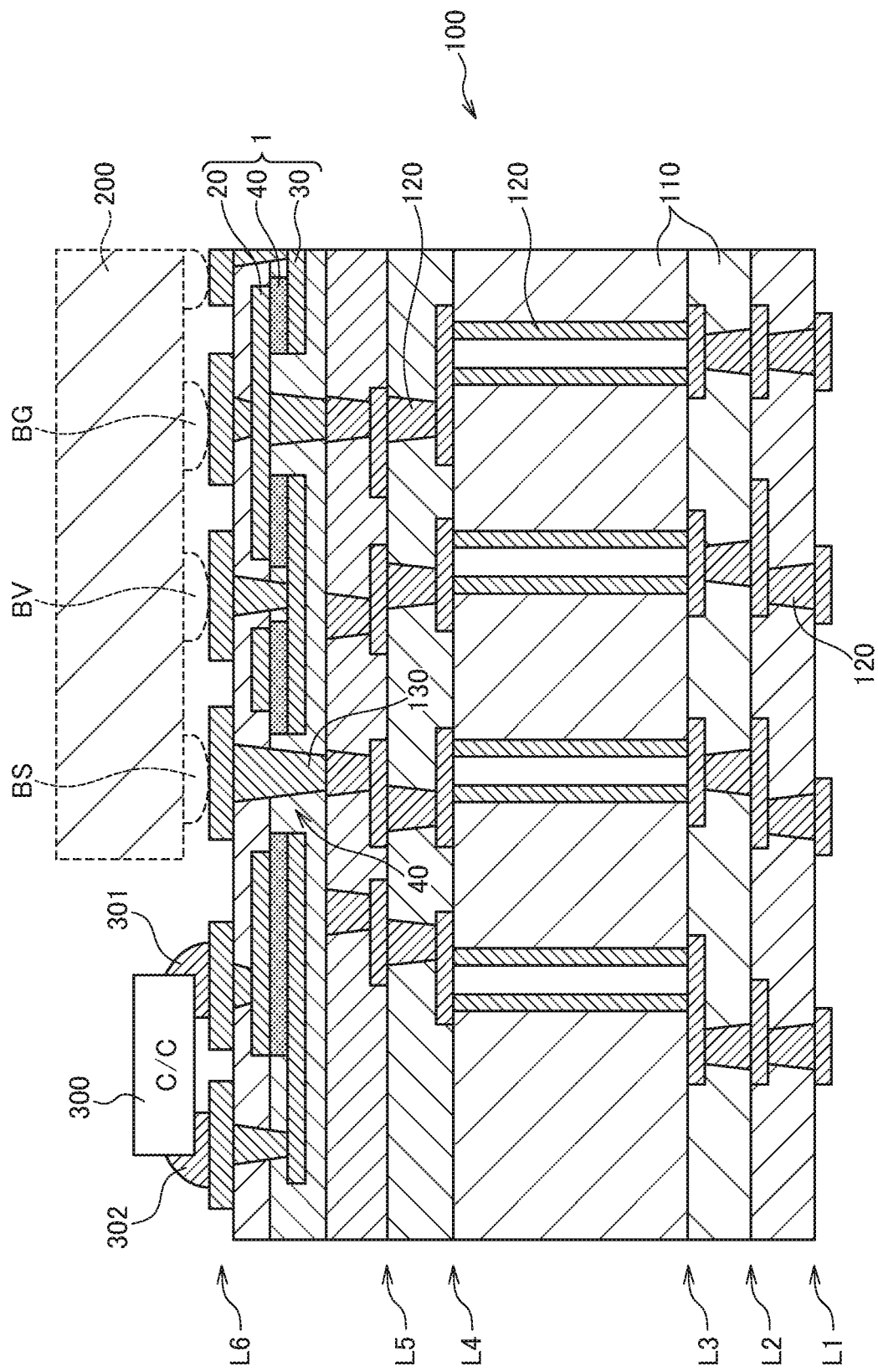
FIG. 3 is a schematic cross-sectional view for explaining the configuration of a circuit board in which the thin film capacitor according to the first embodiment of the present invention is embedded.

FIG. 3 is a schematic cross-sectional view for explaining the configuration of a circuit board 100 in which the thin film capacitor 1 according to the present embodiment is embedded.

The circuit board 100 illustrated in FIG. 3 has six wiring layers L1 to L6, a resin layer 110 that insulates the wiring layers L1 to L6 from one another, and a via conductor 120 that connects different wiring layers. A part of a conductor pattern formed in the wiring layer L1 and a part of a conductor pattern formed in the wiring layer L6 each constitute a land pattern. An IC chip 200 and a laminated ceramic chip capacitor 300 are mounted on the land pattern constituted by the wiring layer L6.

In the thus configured circuit board 100, the thin film capacitor 1 according to the present embodiment is embedded between the wiring layers L5 and L6. As illustrated in FIG. 3, the IC chip 200 is provided with a bump electrode BV for supplying a power supply potential, a bump electrode BG for supplying a ground potential, and a bump electrode BS for transmitting/receiving a signal. The bump electrode BV for supplying a power supply potential is connected to the metal film 30 of the thin film capacitor 1, and the bump electrode BG for supplying a ground potential is connected to the metal film 20 of the thin film capacitor 1. Thus, a decoupling capacitance constituted of the thin film capacitor 1 is connected between the bump electrode BV and the bump electrode BG, allowing the power supply potential and ground potential to be supplied to the IC chip 200 to be stabilized. The metal films 20 and 30 of the thin film capacitor 1 are also connected to terminal electrodes 301 and 302 of the laminated ceramic chip capacitor 300, respectively.

The bump electrode BS for transmitting/receiving a signal is connected to the wiring layer L5 in a lower layer through a via conductor 130 passing through the opening 40. As described above, the thin film capacitor 1 according to the present embodiment has the plurality of openings 40, so that it is possible to connect the bump electrode BS to a conductor pattern in a lower layer at the shortest distance without signal wire routing by thus providing the via conductor 130 passing through the opening 40 without contacting the metal films 20 and 30.

However, not all the via conductors that pass through the opening 40 need to be signal wiring, but some via conductors may be power supply wiring or ground wiring.

As described above, the thin film capacitor 1 according to the present embodiment has the plurality of openings 40, allowing the via conductor that passes through each of the openings 40 to be provided in the circuit board 100.

The following describes a manufacturing method for the thin film capacitor 1 according to the present embodiment.

FIGS. 4 to 8 are process views illustrating a manufacturing method for the thin film capacitor 1 according to the present embodiment.

Figure 4:
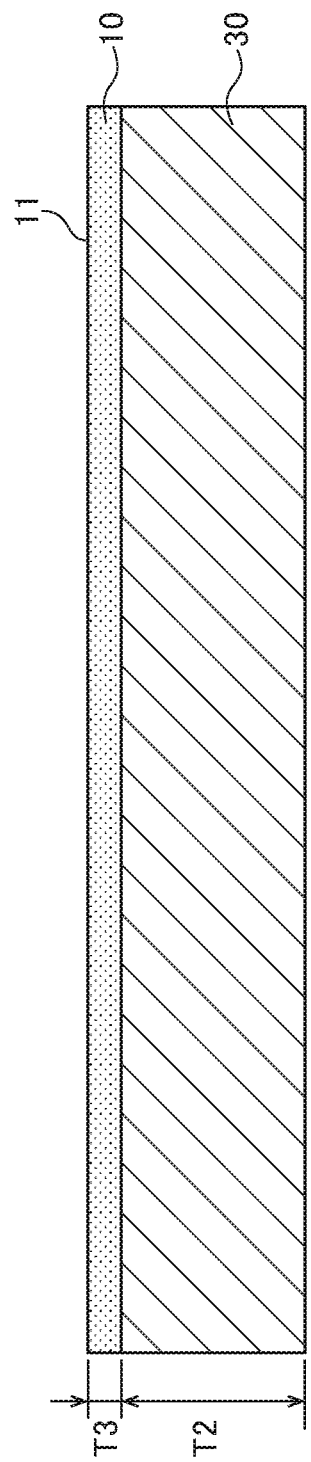
FIGS. 4 to 8 are process views illustrating a manufacturing method for the thin film capacitor according to the first embodiment of the present invention is embedded.

First, as illustrated in FIG. 4, the metal film 30 made of, e.g., nickel (Ni) and having a thickness of T2 is prepared, and the capacitive insulating film 10 having a thickness of T3 is formed on the surface of the metal film 30, followed by baking. Although high temperature is applied also to the metal film 30 during baking, the metal film 30 can be made to withstand baking temperature by using refractory metal such as nickel (Ni) as the material thereof.

Figure 5:
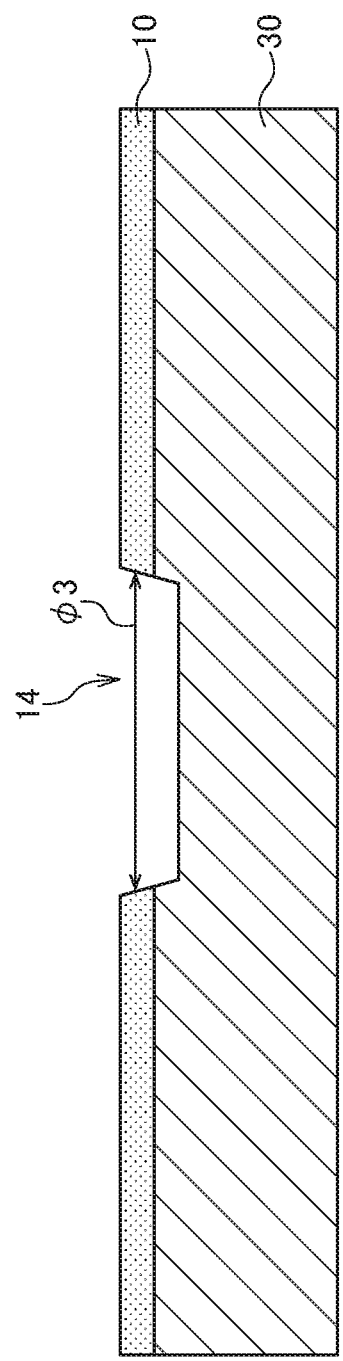

Then, as illustrated in FIG. 5, the capacitive insulating film 10 is patterned to form an opening 14 in the capacitive insulating film 10. The opening 14 is a part to be the opening 40 by way of the subsequent processes and has a size of $\phi 3$.

Figure 6:
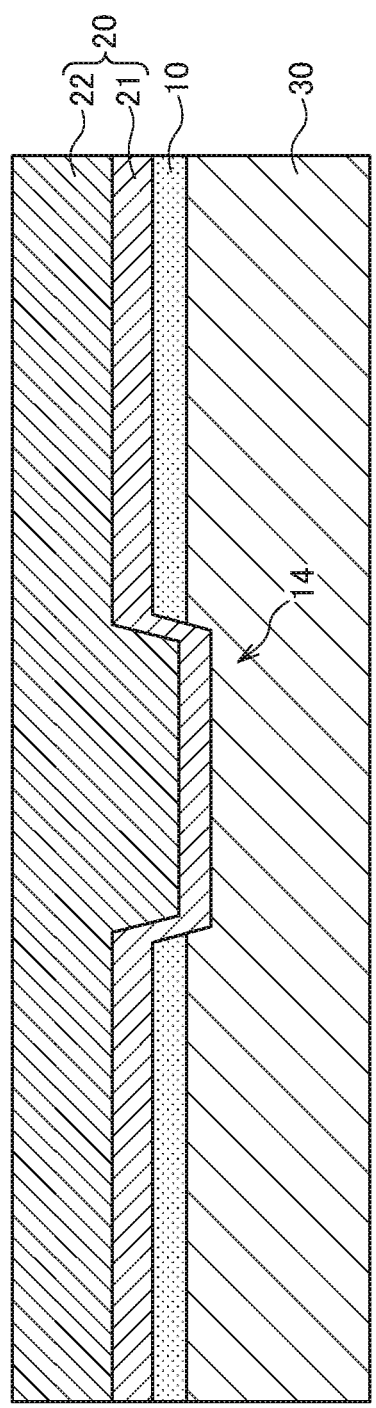

Then, as illustrated in FIG. 6, the metal film 20 composed of the seed layer 21 and plated film 22 is formed on the surface 11 of the capacitive insulating film 10. The seed layer 21 is, e.g., a laminated film of nickel (Ni) and copper (Cu) and formed through a thin-film process such as a sputtering method. On the other hand, the plated film 22 is, e.g., an electroplated copper (Cu) film. The metal film 20 is formed not only on the surface 11 of the capacitive insulating film 10, but also in the opening 14, so that the metal films 20 and 30 contact each other in the opening 14.

Figure 7:
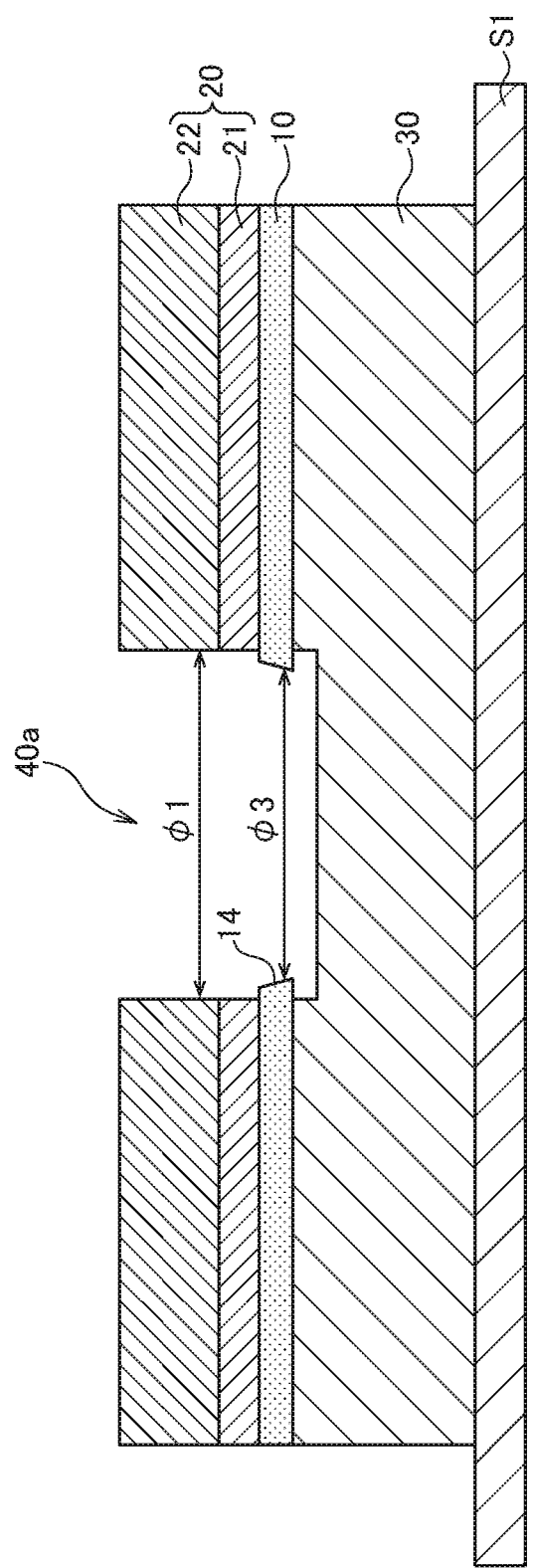

Then, as illustrated in FIG. 7, a support panel S1 is bonded to the metal film 30 side, and then an opening 40a is formed in the metal film 20 by patterning. The opening 40a is formed in a location overlapping the opening 14 and has a size of $\phi 1$.

When the metal film 20 is patterned, the size $\phi 1$ tends to decrease in the depth direction, so that it is preferable to perform patterning so as to make the size $\phi 1$ at the bottom portion larger than the size $\phi 3$ of the opening 14. The opening 40a overlaps the opening 14, so that the metal film 30 is overetched at this portion.

Figure 8:
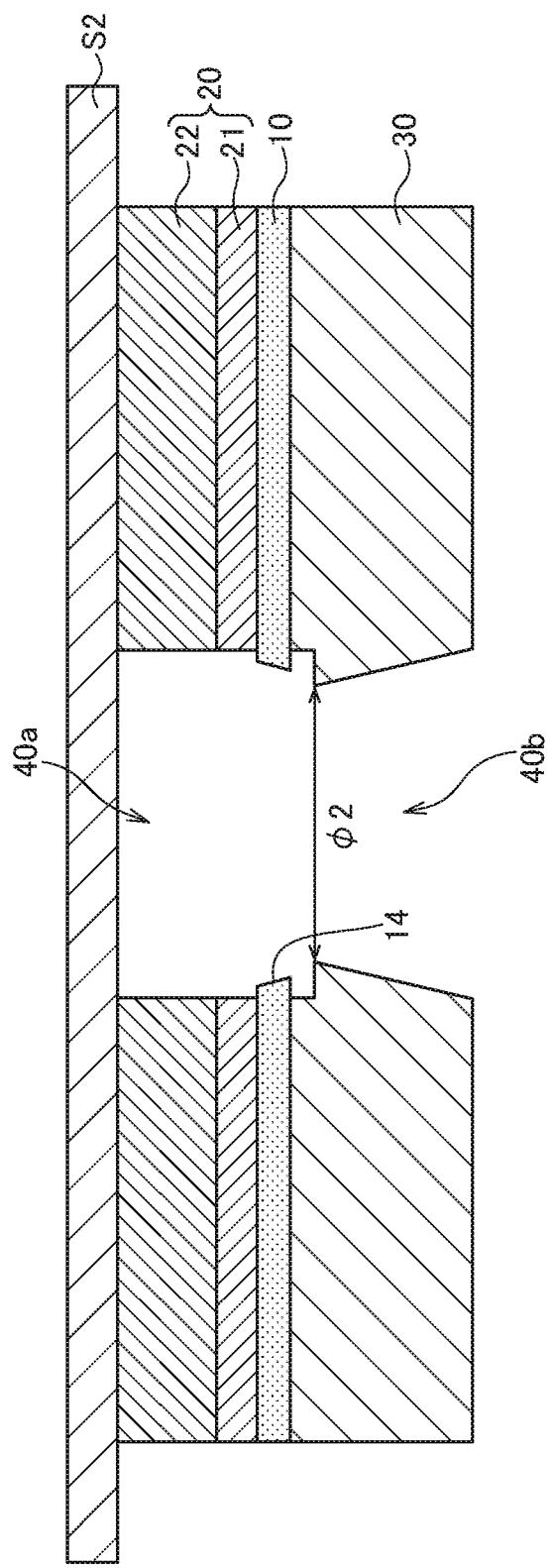

Then, as illustrated in FIG. 8, the support panel S1 is peeled off, and another support panel S2 is bonded to the metal film 20 side. After that, the metal film 30 is patterned from the back side to form an opening 40b. The opening 40b is formed in a location overlapping the opening 40a, whereby the opening 40 constituted of the openings 40a and 40b is formed. When the metal film 30 is patterned, the size $\phi 2$ tends to decrease in the depth direction, so that it is preferable to perform patterning so as to make the size $\phi 2$ at the bottom portion smaller than the size $\phi 1$.

Figure 9:
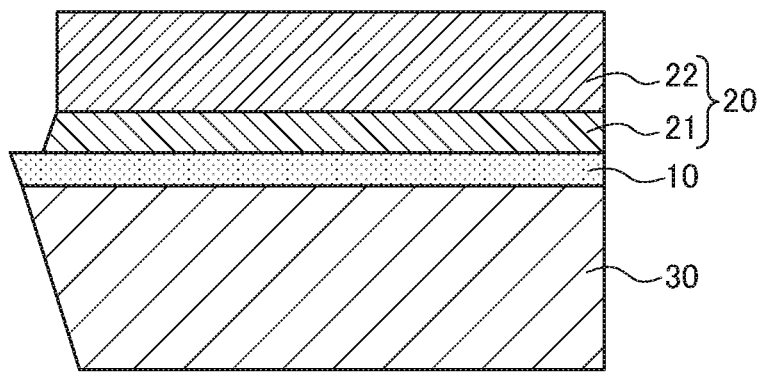
FIG. 9 is a schematic cross-sectional view for indicating an edge of the individual thin film capacitor at which a dummy opening is formed.

After the support panel S2 is peeled off, dicing is performed in predetermined locations, whereby the thin film capacitor 1 illustrated in FIG. 1 is completed. In the dicing location, a dummy opening 40 may be formed in advance, thereby facilitating dicing work. In this case, the edge of the individual thin film capacitor 1 at which the dummy opening 40 is formed has the same cross section as the opening 40 as illustrated in FIG. 9.

As described above, in the present embodiment, the metal film 30 is patterned so as to make the size $\phi 2$ smaller than the size $\phi 1$, allowing the rigidity of the metal film 30 to be ensured. In addition, the metal film 30 is overetched when the metal film 20 is patterned, allowing the capacitive insulating film 10 to protrude to the inside of the opening 40. As a result, the creepage distance between the metal films 20 and 30 inside the opening 40 is increased, thereby preventing deterioration in withstand voltage.

Second Embodiment

Figure 10:
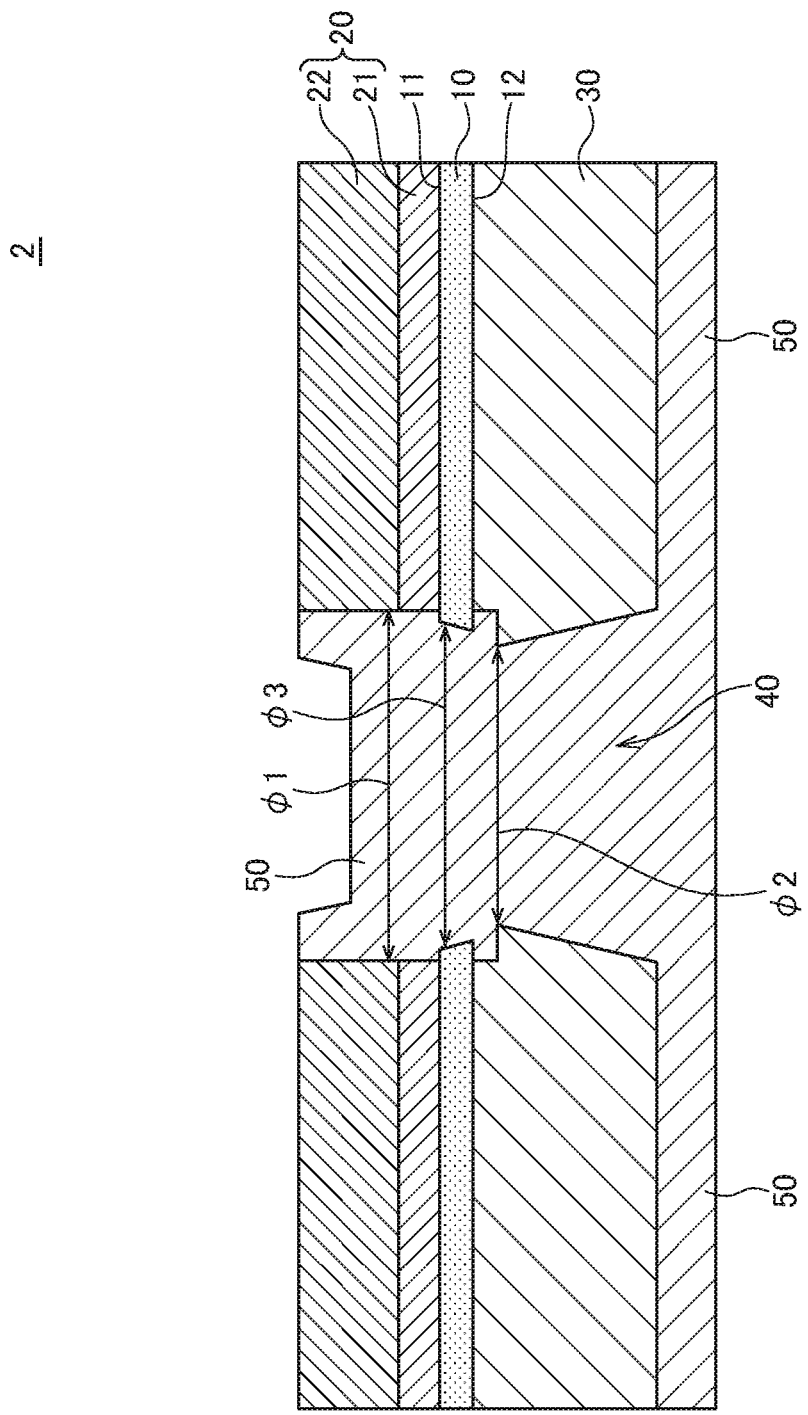
FIG. 10 is a schematic cross-sectional view for explaining the configuration of a thin film capacitor according to a second embodiment of the present invention.

FIG. 10 is a schematic cross-sectional view for explaining the configuration of a thin film capacitor 2 according to the second embodiment of the present invention. The planar shape of the thin film capacitor 2 according to the present embodiment is as illustrated in FIGS. 2A and 2B.

As illustrated in FIG. 10, the thin film capacitor 2 according to the second embodiment differs from the thin film capacitor 1 according to the first embodiment in that the inside of the opening 40 is filled with insulating resin 50. Other basic configurations are the same as those of the thin film capacitor 1 according to the first embodiment, so the same reference numerals are given to the same elements, and overlapping description will be omitted.

The following describes a manufacturing method for the thin film capacitor 2 according to the present embodiment.

Figure 11:
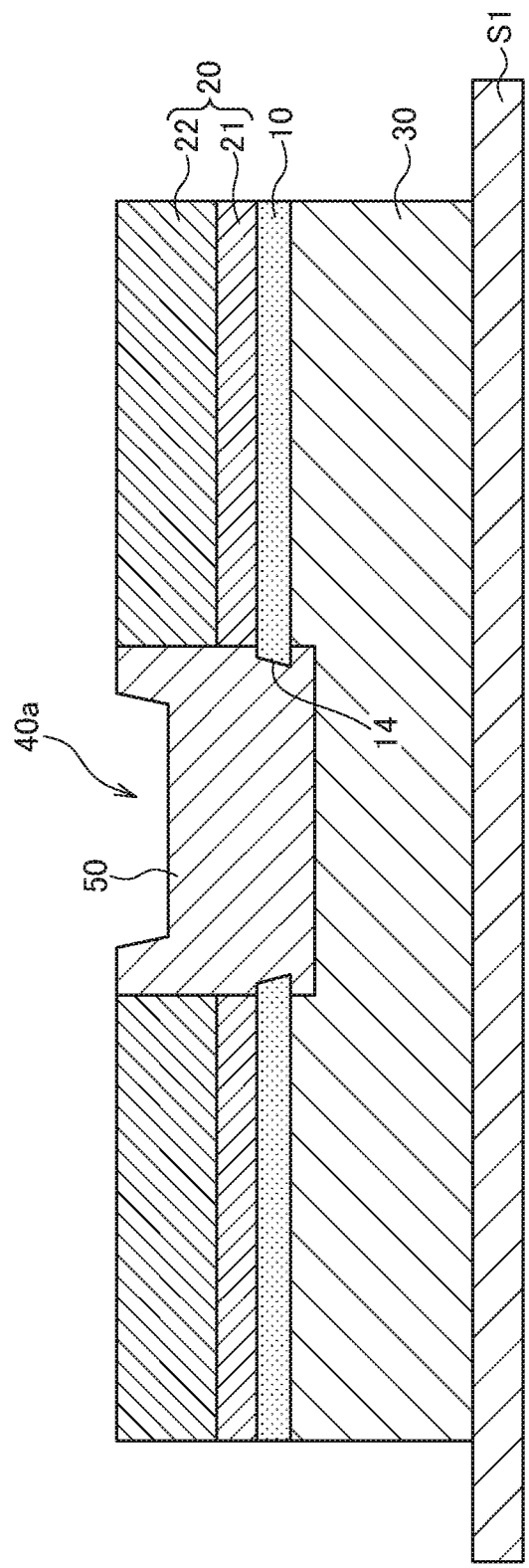
FIGS. 11 to 13 are process views illustrating a manufacturing method for the thin film capacitor according to the second embodiment of the present invention.
Figure 12:
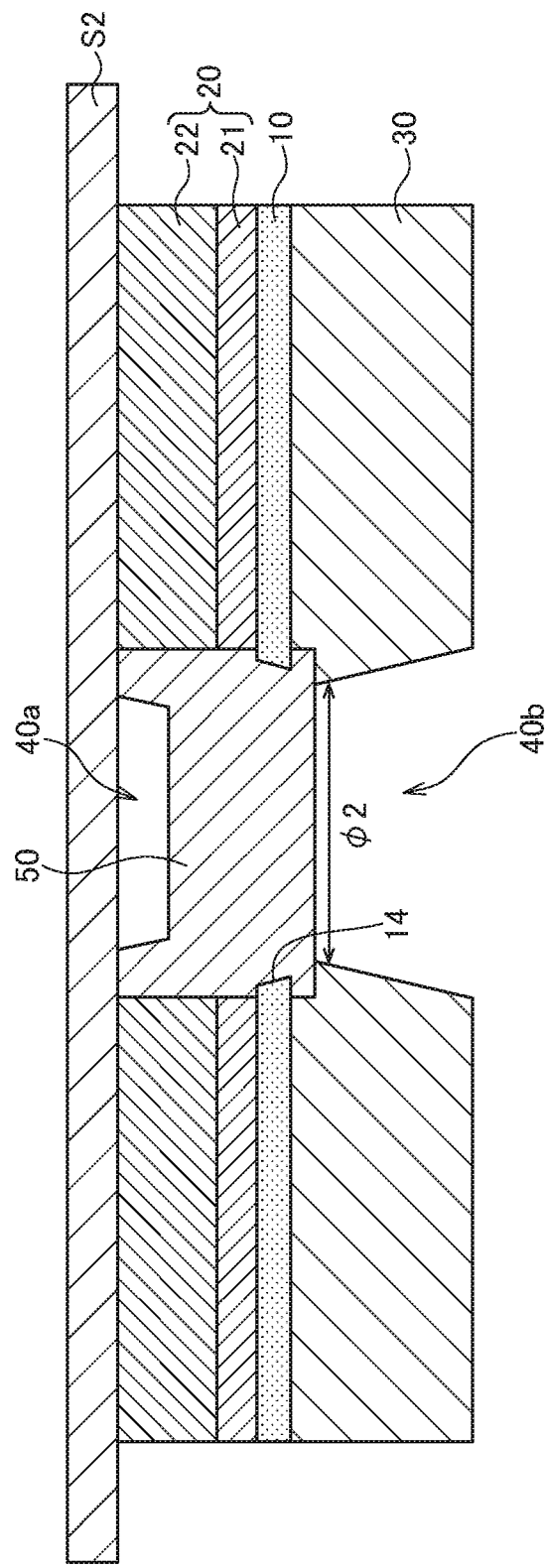
Figure 13:
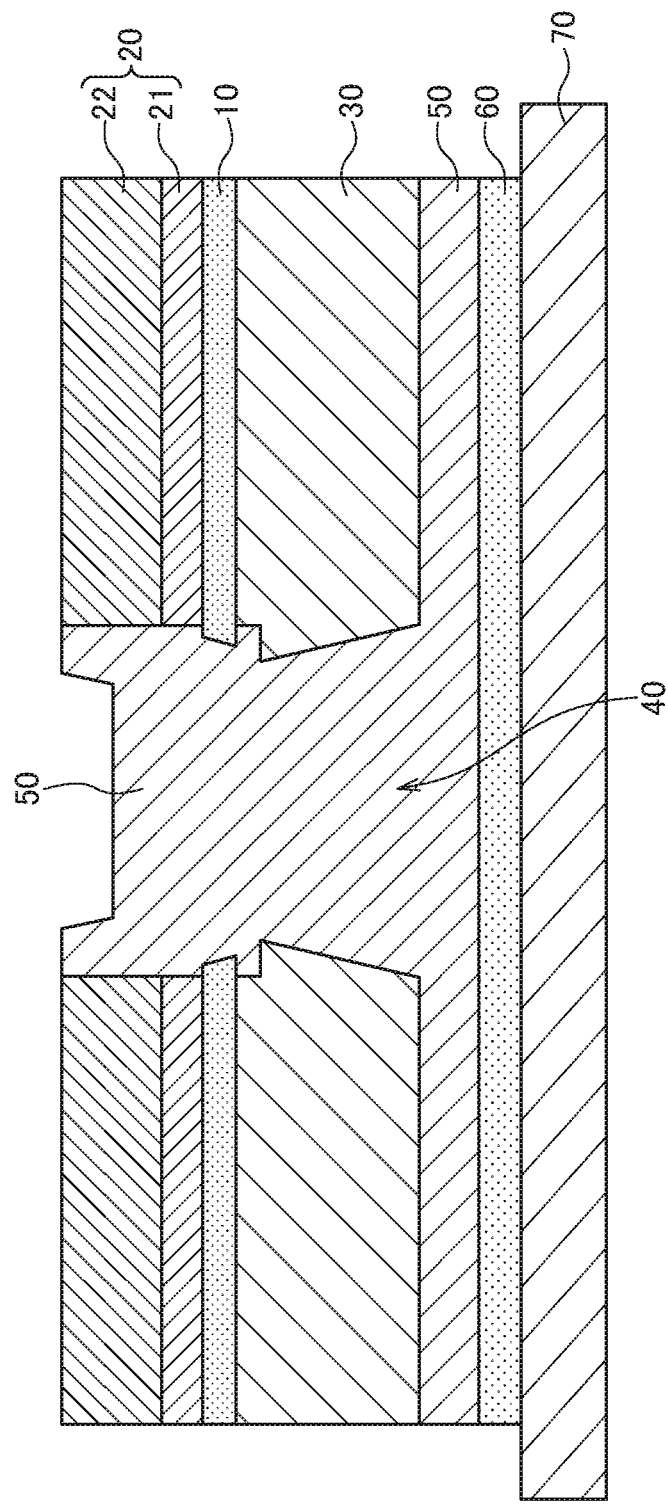

FIGS. 11 to 13 are process views illustrating a manufacturing method for the thin film capacitor 2 according to the present embodiment.

First, the processes illustrated in FIGS. 4 to 7 are performed. After that, as illustrated FIG. 11, the entire upper surface of the metal film 20 is covered with the insulating resin 50 so as to fill the opening 40a therewith, and then the unnecessary insulating resin 50 is removed so as to expose the upper surface of the metal film 20. As a result, the opening 40a is filled with the insulating resin 50.

Then, as illustrated in FIG. 12, the support panel S1 is peeled off, and another support panel S2 is bonded to the metal film 20 side. After that, the metal film 30 is patterned from the back side to form the opening 40b. The opening 40b is formed in a location overlapping the opening 40a, whereby the opening 40 constituted of the openings 40a and 40b is formed.

Then, as illustrated in FIG. 13, the entire lower surface of the metal film 30 is covered with the insulating resin 50 so as to fill the opening 40b therewith. As a result, the opening 40 is filled with the insulating resin 50. Then, after the support panel S2 is peeled off, the insulating resin 50 is bonded to a dicing tape 70 through a die attach film 60, and dicing is performed in predetermined locations, whereby the thin film capacitor 2 illustrated in FIG. 10 is completed.

As described above, in the thin film capacitor 2 according to the second embodiment, the inside of the opening 40 is filled with the insulating resin 50, allowing improvement in product reliability in a shipping state before embedding in the circuit board.

Third Embodiment

Figure 14:
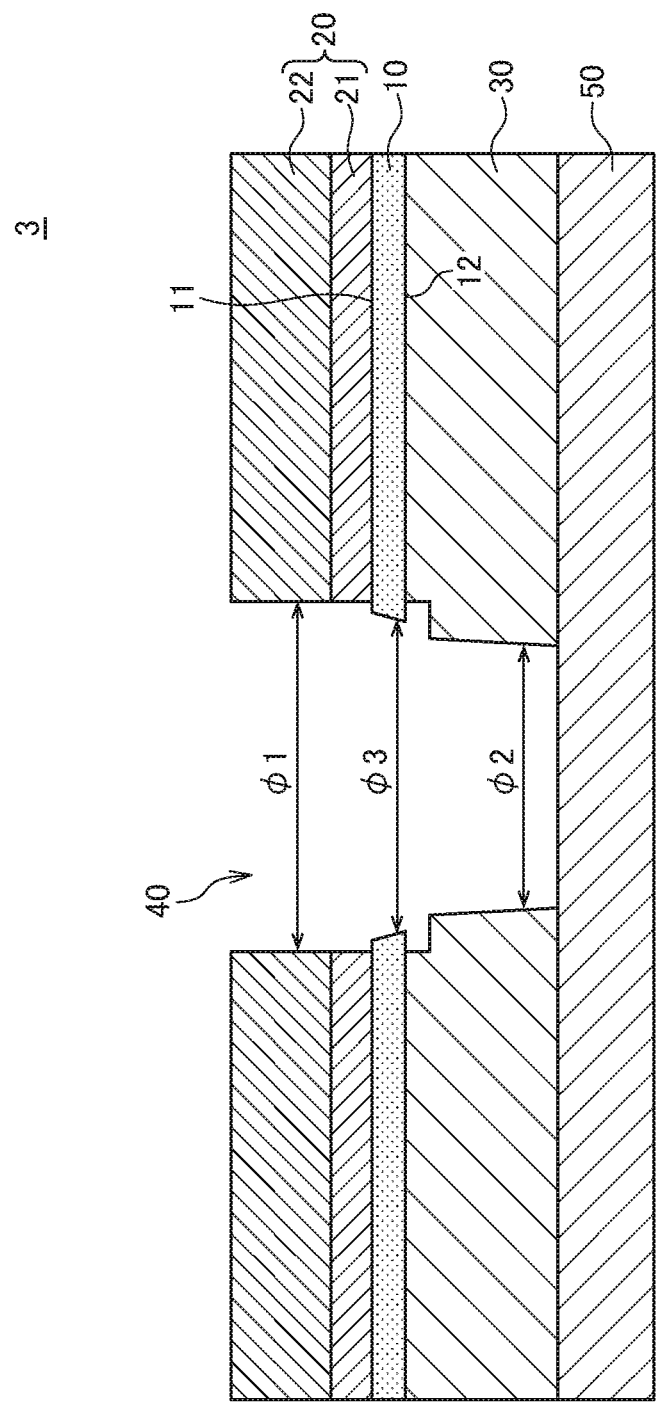
FIG. 14 is a schematic cross-sectional view for explaining the configuration of a thin film capacitor according to a third embodiment of the present invention.
Figure 15:
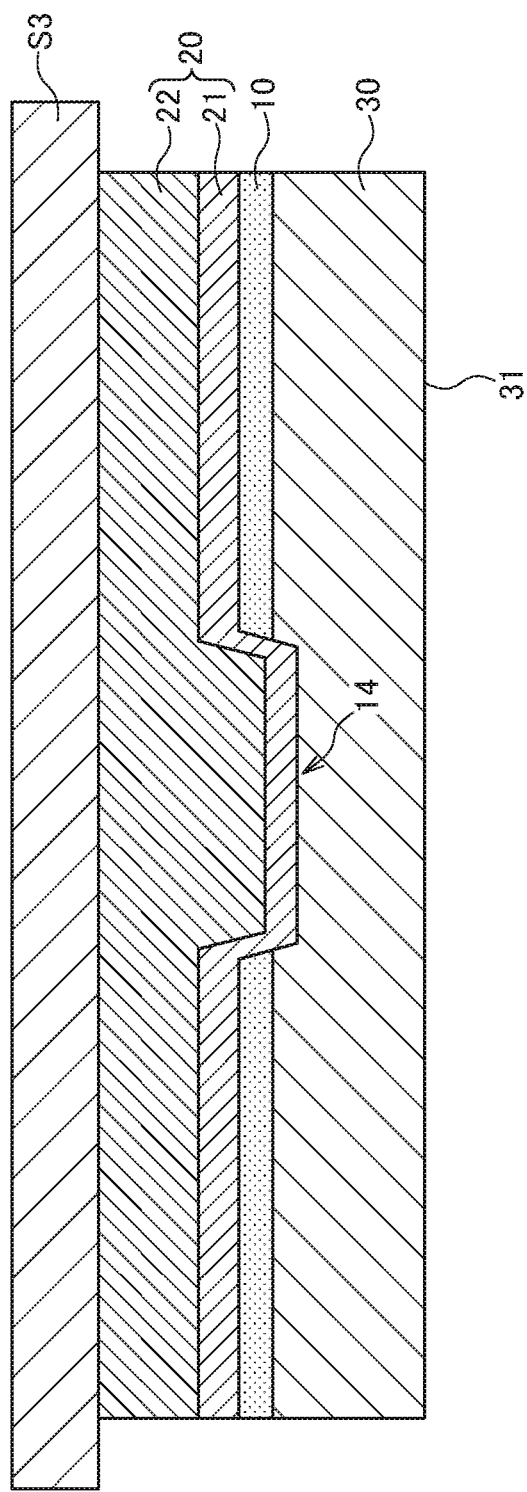
FIGS. 15 to 18 are process views illustrating a manufacturing method for the thin film capacitor according to the third embodiment of the present invention.

FIG. 14 is a schematic cross-sectional view for explaining the configuration of a thin film capacitor 3 according to the third embodiment of the present invention. The planar shape of the thin film capacitor 3 according to the present embodiment is as illustrated in FIGS. 2A and 2B.

As illustrated in FIG. 14, the basic configuration of the thin film capacitor 3 according to the third embodiment is the same as that of the thin film capacitor 1 according to the first embodiment. That is, the thickness T2 of the metal film 30 formed on the surface 12 of the capacitive insulating film 10 is larger than the thickness T1 of the metal film 20 formed on the surface 11 of the capacitive insulating film 10, and the size $\phi1$ of the opening 40 in the metal film 20 is larger than the size $\phi2$ of the opening 40 in the metal film 30. However, in the thin film capacitor 3 according to the present embodiment, the opening 40 formed in the metal film 30 is tapered in a form reversal of the opening 40 of the thin film capacitor 1 according to the first embodiment.

Even with such a configuration, it is possible to suppress warpage as in the thin film capacitor 1 according to the present embodiment. Further, the capacitive insulating film 10 protrudes to the inside of the opening 40, so that it is possible to prevent deterioration in withstand voltage.

The following describes a manufacturing method for the thin film capacitor 3 according to the present embodiment.

FIGS. 15 to 18 are process views illustrating a manufacturing method for the thin film capacitor 3 according to the present embodiment.

Figure 16:
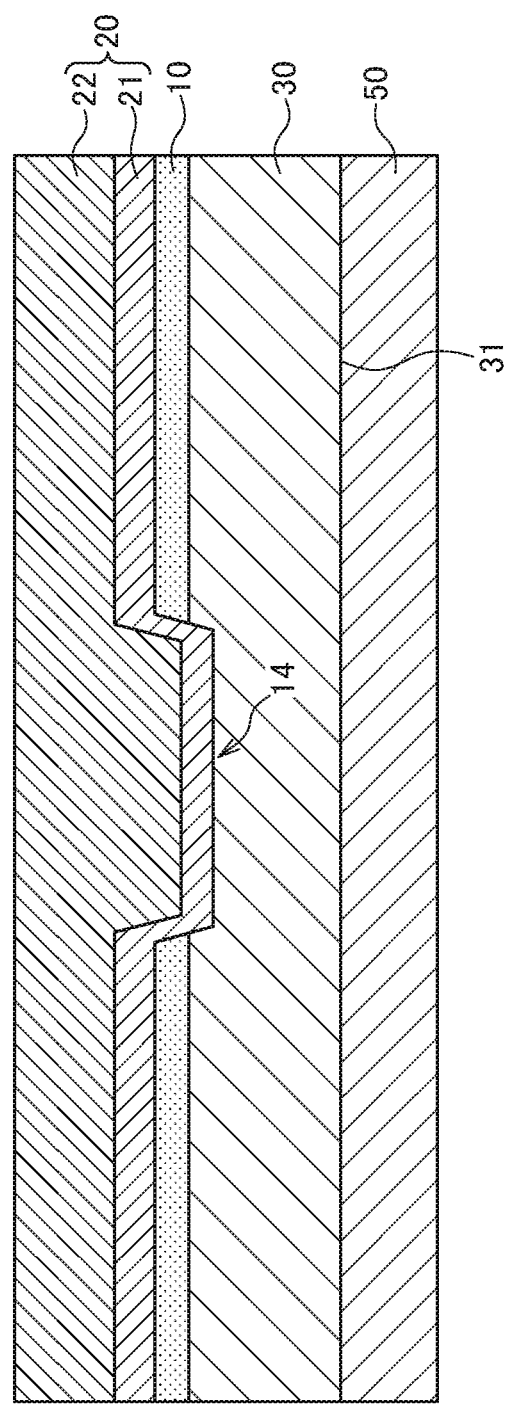

First, the processes illustrated in FIGS. 4 to 6 are performed. Next, as illustrated FIG. 15, a support panel S3 is bonded to the metal film 20 side. In this state, etching or polishing is performed from a back surface 31 of the metal film 30 to reduce the thickness of the metal film 30. Then, as illustrated in FIG. 16, the support panel S3 is peeled off, and the insulating resin 50 is formed on the back surface 31 of the metal film 30.

Figure 17:
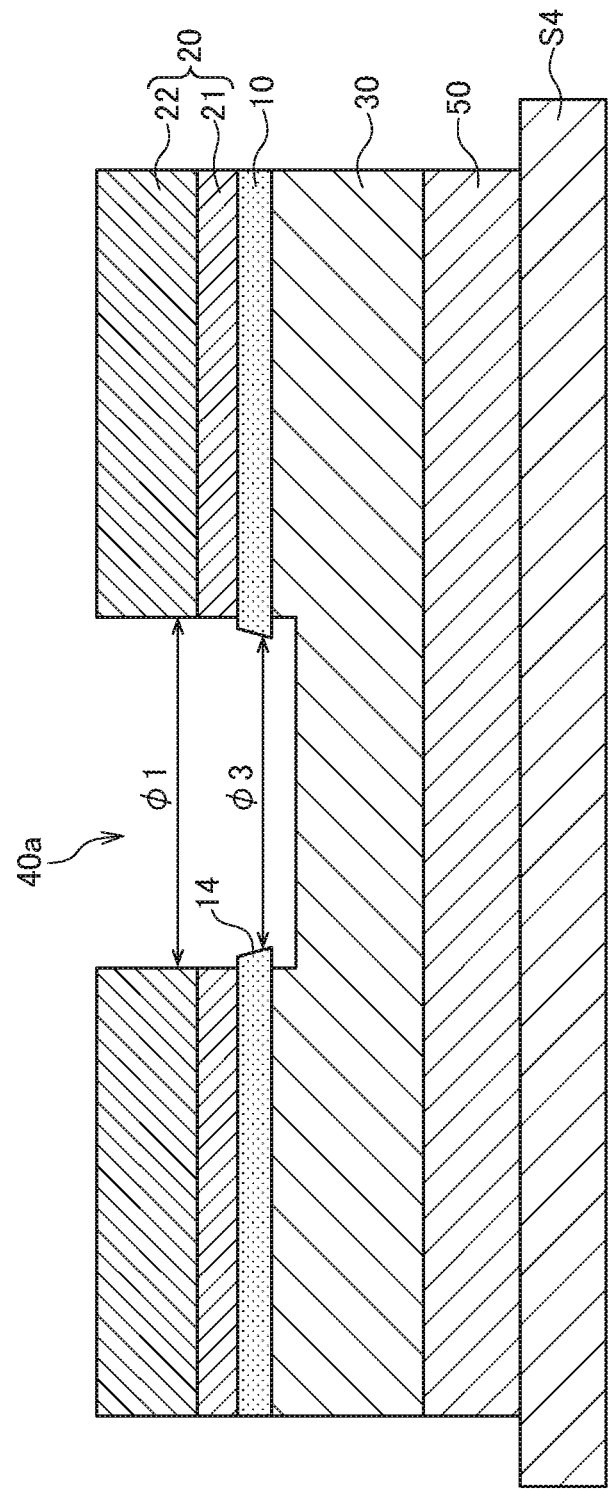

Then, as illustrated in FIG. 17, another support panel S4 is bonded to the insulating resin 50 side, and then patterning is performed to form the opening 40a in the metal film 20. The opening 40a is formed at a position overlapping the opening 14 and has a size of $\phi1$. Also in the present embodiment, the metal film 30 is overetched at a part thereof overlapping the opening 14.

Figure 18:
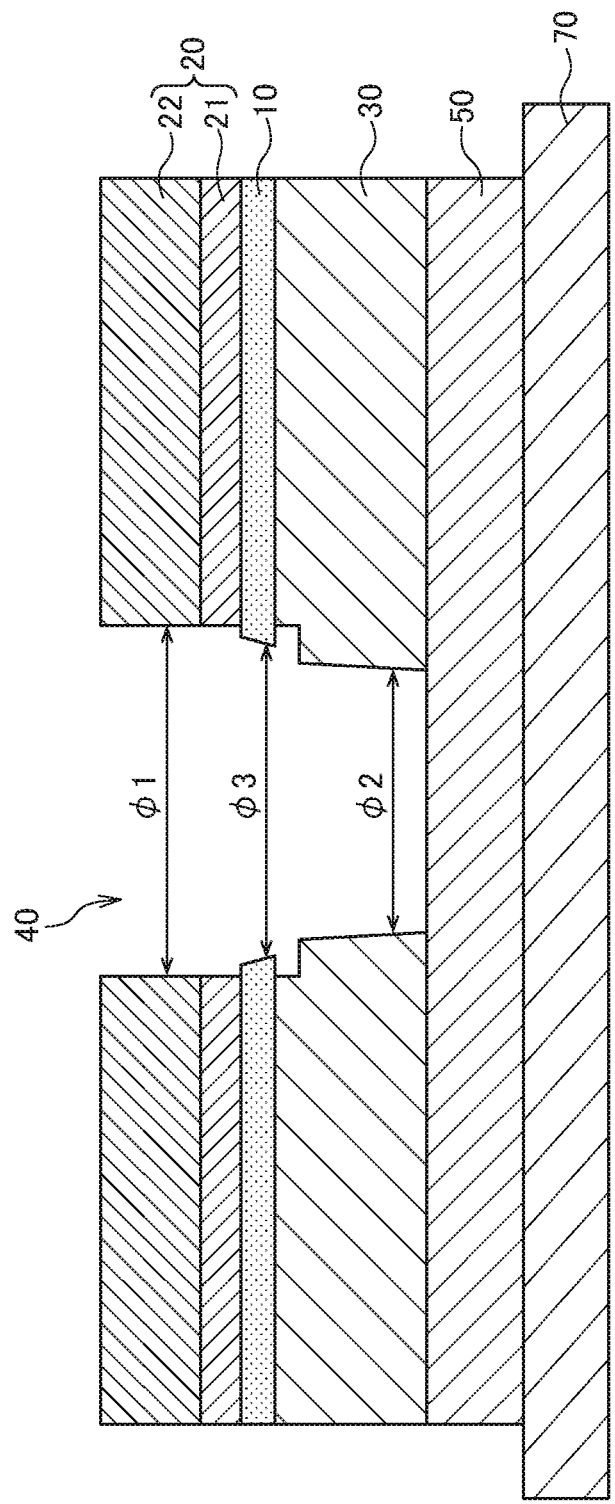

Then, as illustrated in FIG. 18, the metal film 30 exposed to the opening 40a is removed by patterning to form the opening 40. At this time, it is possible to reduce damage applied to the plated film 22 by performing patterning under a condition that the etching selectivity of a metal material (e.g., Ni) constituting the metal film 30 relative to a metal material (e.g., Cu) constituting the plated film 22 is as high as possible. Then, after the support panel S4 is peeled off, the insulating resin 50 is bonded to the dicing tape 70 and dicing is performed in predetermined locations, whereby the thin film capacitor 3 illustrated in FIG. 14 is completed.

As exemplified in the present embodiment, the metal films 20 and 30 may be patterned from the same direction in the present invention.

Fourth Embodiment

Figure 19:
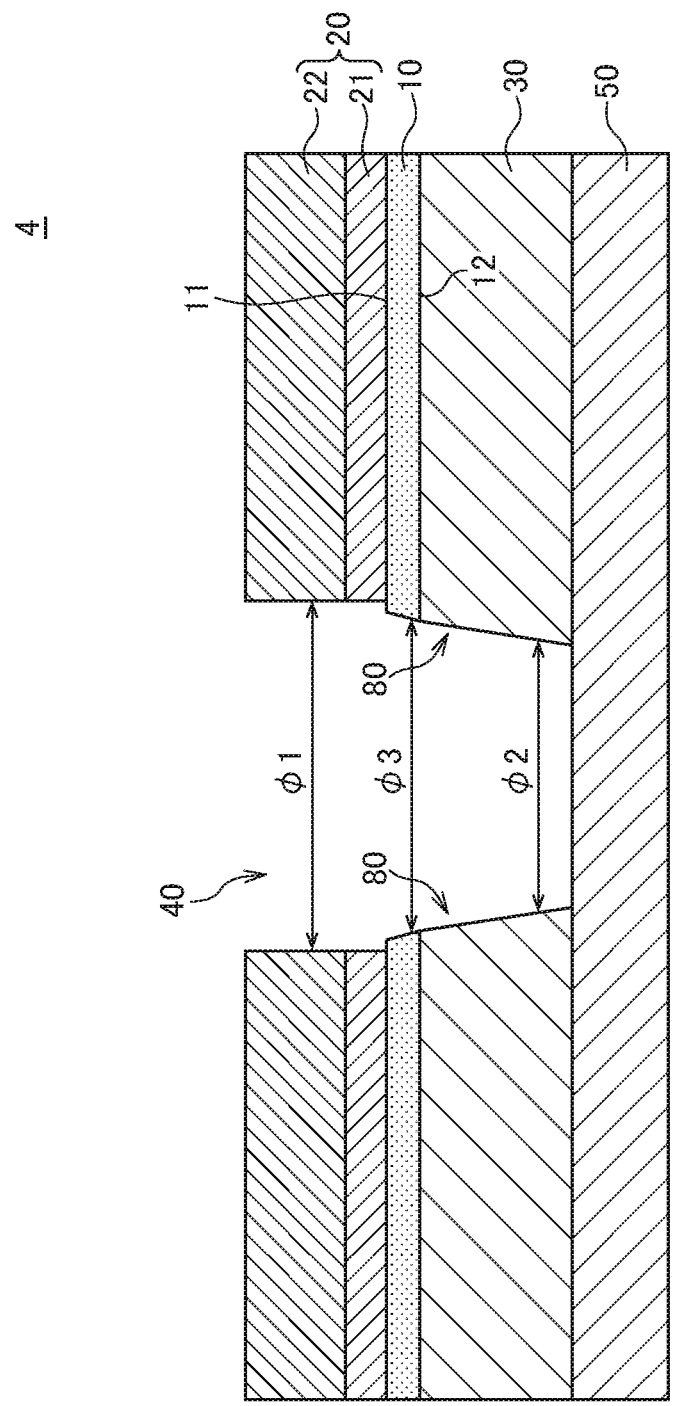
FIG. 19 is a schematic cross-sectional view for explaining the configuration of a thin film capacitor according to a fourth embodiment of the present invention.

FIG. 19 is a schematic cross-sectional view for explaining the configuration of a thin film capacitor 4 according to the fourth embodiment of the present invention. The planar shape of the thin film capacitor 4 according to the present embodiment is as illustrated in FIGS. 2A and 2B.

As illustrated in FIG. 19, the thin film capacitor 4 according to the fourth embodiment differs from the thin film capacitor 3 according to the third embodiment in that an interface 80 between the lower edge of the capacitive insulating film 10 and the upper edge of the metal film 30 which are exposed inside the opening 40 does not have a step. That is, the size of the capacitive insulating film 10 at the interface 80 and the size of the metal film 30 at the interface 80 are equal to each other. Other configurations are the same as those of the thin film capacitor 3 according to the third embodiment.

As exemplified in the present embodiment, the capacitive insulating film 10 need not protrude from both the metal films 20 and 30 inside the opening 40.

It is apparent that the present invention is not limited to the above embodiments, but may be modified and changed without departing from the scope and spirit of the invention.

EXAMPLES

A 15×15 mm thin film capacitor having the same configuration as the thin film capacitor 1 illustrated in FIG. 1 and having 2000 circular openings 40 was produced, and the warpage amount was measured. As the capacitive insulating film 10, barium titanate having the thickness T3 of 3 μm was used. As the plated film 22 constituting the metal film 20, copper (Cu) was used. As the metal film 30, nickel (Ni) was used. The thicknesses T1 and T2 of the respective metal films 20 and 30, and the sizes (diameters) $\phi1$ and $\phi2$ of parts of the opening 40 penetrating the metal films 20 and 30, respectively, were set in different combinations for each sample.

The results are illustrated in Table 1. The capacitance (%) shown in Table 1 is represented by a percentage when the capacitance in Sample 1 having no opening 40 is set as 100.

TABLE 1

| SAMPLE | $\phi1$ (μm) | $\phi2$ (μm) | T1 (μm) | T2 (μm) | Warpage Amount (μm) | Capacitance (%) |
|---|---|---|---|---|---|---|
| 1 | 0 | 0 | 10 | 20 | 55 | 100 |
| 2 | 100 | 150 | 10 | 20 | 108 | 84 |
| 3 | 150 | 150 | 10 | 20 | 48 | 84 |
| 4 | 200 | 150 | 10 | 20 | 16 | 72 |
| 5 | 250 | 150 | 10 | 20 | 12 | 56 |
| 6 | 200 | 100 | 10 | 20 | 14 | 72 |
| 7 | 200 | 150 | 10 | 20 | 18 | 72 |
| 8 | 200 | 200 | 10 | 20 | 43 | 72 |
| 9 | 200 | 150 | 5 | 20 | 8 | 72 |
| 10 | 200 | 150 | 10 | 20 | 12 | 72 |

TABLE 1-continued

| SAMPLE | ø1 (μm) | ø2 (μm) | T1 (μm) | T2 (μm) | Warpage Amount (μm) | Capacitance (%) |
|---|---|---|---|---|---|---|
| 11 | 200 | 150 | 15 | 20 | 19 | 72 |
| 12 | 200 | 150 | 20 | 20 | 35 | 72 |
| 13 | 200 | 150 | 10 | 5 | 45 | 72 |
| 14 | 200 | 150 | 5 | 5 | 32 | 72 |
| 15 | 200 | 150 | 5 | 8 | 18 | 72 |
| 16 | 200 | 150 | 5 | 10 | 11 | 72 |
| 17 | 200 | 150 | 5 | 15 | 9 | 72 |
| 18 | 200 | 150 | 5 | 25 | 8 | 72 |
| 19 | 200 | 150 | 5 | 35 | 5 | 72 |
| 20 | 200 | 150 | 5 | 50 | 6 | 72 |
| 21 | 200 | 150 | 20 | 15 | 38 | 72 |
| 22 | 200 | 150 | 20 | 20 | 41 | 72 |
| 23 | 200 | 150 | 20 | 25 | 17 | 72 |
| 24 | 200 | 150 | 20 | 35 | 15 | 72 |
| 25 | 200 | 150 | 20 | 50 | 8 | 72 |

As shown in Table 1, the warpage amount in Sample 1 having no opening 40 is 55 μm. On the other hand, in Samples 4 to 7, 9 to 11, 15 to 20, and 23 to 25, in which both T1<T2 and φ1>φ2 are satisfied, the warpage amount is less than 20 μm and, thus, it is confirmed that the warpage is significantly suppressed. In Samples 2, 3, 8, 12 to 14, 21, and 22 in which the above conditions are not satisfied, the warpage amount is 30 μm or more. That is, the warpage cannot be sufficiently suppressed although many openings 40 are formed.

What is claimed is:

1. A thin film capacitor comprising:
a capacitive insulating film;
a first metal film formed on one surface of the capacitive insulating film; and
a second metal film formed on another surface of the capacitive insulating film and made of a metal material different from that of the first metal film,
wherein the thin film capacitor has an opening penetrating the capacitive insulating film, first metal film, and second metal film,
wherein the second metal film is thicker than the first metal film, and
wherein a first size of a part of the opening that penetrates the first metal film is larger than a second size of a part of the opening that penetrates the second metal film,
wherein a third size of a part of the opening that penetrates the capacitive insulating film is smaller than the first size, and
wherein the third size is smaller than a fourth size of a part of the opening that penetrates the second metal film at a boundary of the capacitive insulating film.

2. The thin film capacitor as claimed in claim 1,
wherein the thin film capacitor has a plurality of openings including the opening, and
wherein a ratio of a capacitive area where the capacitive insulating film is sandwiched between the first and second metal films in a plan view to a sum of the capacitive area and a non-capacitive area where the capacitive insulating film is not present or the capacitive insulating film is not sandwiched between the first and second metal films in a plan view is set to 80% or less.

3. The thin film capacitor as claimed in claim 1, wherein the opening is filled with an insulating material.

4. A circuit board in which a thin film capacitor is embedded,
wherein the thin film capacitor comprises:
a capacitive insulating film;
a first metal film formed on one surface of the capacitive insulating film; and
a second metal film formed on another surface of the capacitive insulating film and made of a metal material different from that of the first metal film,
wherein the thin film capacitor has an opening penetrating the capacitive insulating film, first metal film, and second metal film,
wherein the second metal film is thicker than the first metal film,
wherein a first size of a part of the opening that penetrates the first metal film is larger than a second size of a part of the opening that penetrates the second metal film, and
wherein the circuit board includes a via conductor that passes through the opening without contacting the first and second metal films
wherein a third size of a part of the opening that penetrates the capacitive insulating film is smaller than the first size, and
wherein the third size is smaller than a fourth size of a part of the opening that penetrates the second metal film at a boundary of the capacitive insulating film.

5. The thin film capacitor as claimed in claim 1, wherein the second size is smaller than the third size.

6. The thin film capacitor as claimed in claim 1, wherein the fourth size is smaller than the first size.

7. The thin film capacitor as claimed in claim 3, wherein, in the opening, the insulating material is in contact with inner walls of the capacitive insulating film, first metal film, and second metal film.

8. A thin film capacitor comprising:
a first metal film having a first opening having a first size;
a second metal film having a second opening having a second size, the second metal film being thicker than the first metal film; and
a capacitive insulating film having a third opening having a third size,
wherein the capacitive insulating film is disposed between the first metal film and the second metal film, and that the first, second, and third openings overlap one another,
wherein the third size is smaller than the first size and larger than the second size,
wherein the second opening includes a first section adjacent to the capacitive insulating film and a second section farther from the capacitive insulating film than the first section, and
wherein a size of the second opening in the second section is the second size.

9. The thin film capacitor as claimed in claim 8, further comprising an insulating material being in contact with inner walls of the first, second, and third openings.

10. A thin film capacitor comprising:
a first metal film having a first opening having a first size;
a second metal film having a second opening having a second size, the second metal film being thicker than the first metal film; and
a capacitive insulating film having a third opening having a third size, wherein the capacitive insulating film is disposed between the first metal film and the second metal film, and that the first, second, and third openings overlap one another, wherein the third size is smaller than the first size and larger than the second size, wherein an inner wall of the second opening is tapered such that the second opening is smaller as approaching the capacitive insulating film, and wherein an inner wall of the third opening is tapered such that the third opening is smaller as approaching the second metal film.

11. The thin film capacitor as claimed in claim 10, wherein a size of the second opening in the first section is a fourth size that is larger than the second size.

12. The thin film capacitor as claimed in claim 11, wherein the fourth size is larger than the third size.

13. The thin film capacitor as claimed in claim 12, wherein the fourth size is smaller than the first size.

14. The thin film capacitor as claimed in claim 8, wherein the second metal film comprises a different material from the first metal film.

\* \* \* \* \*